Figure 1:
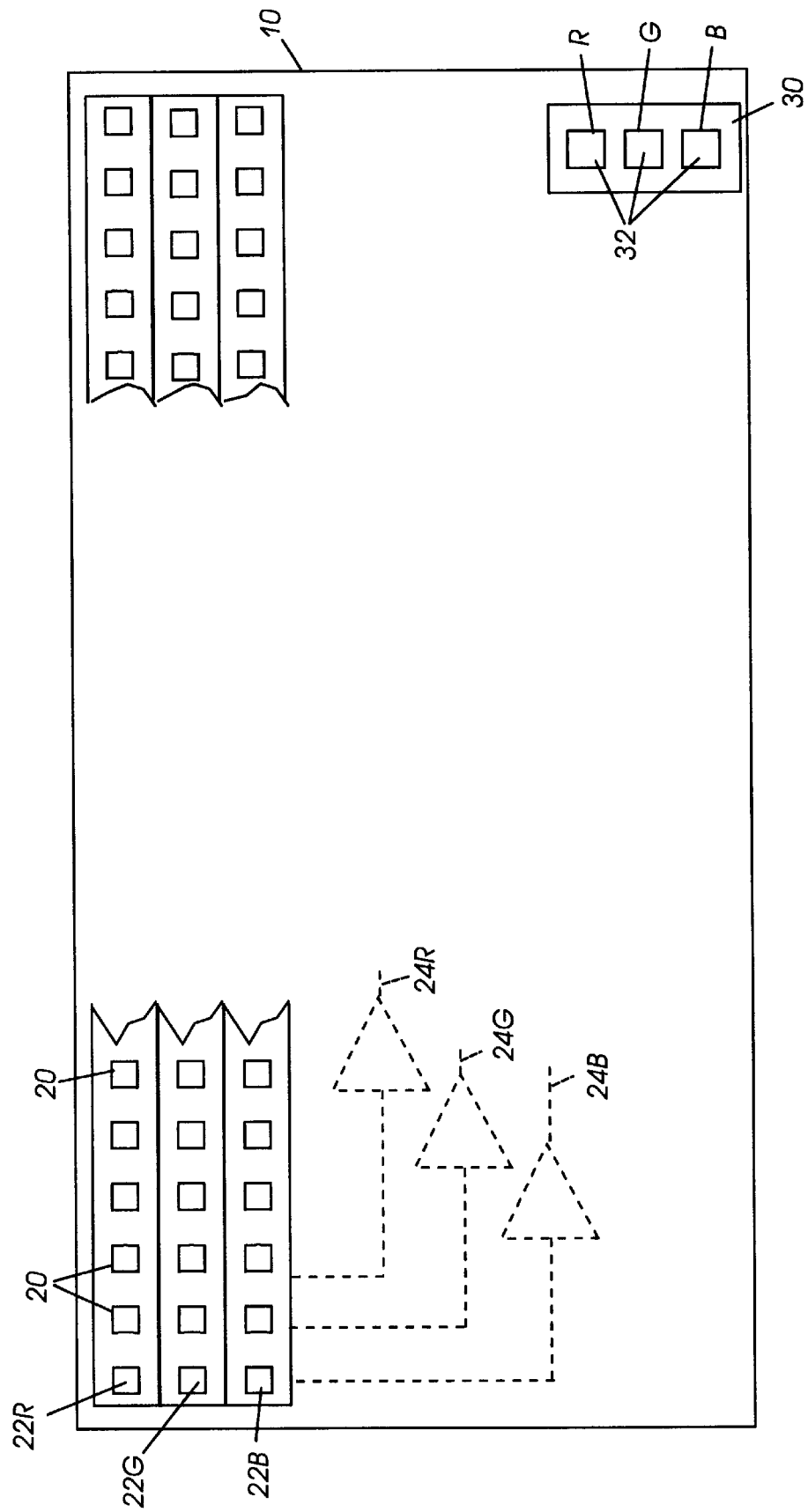

United States Patent [19]
Jedlicka et al.

[11] Patent Number: 5,808,297
[45] Date of Patent: Sep. 15, 1998

[54] REFLECTIVE TEST PATCHES FOR TRANSLUCENT COLOR FILTERS IN PHOTOSENSITIVE SEMICONDUCTOR CHIPS

[75] Inventors: Josef E. Jedlicka, Rochester; Brian T. Ormond, Webster, both of N.Y.

[73] Assignee: Xerox Corporation, Stamford, Conn.

[21] Appl. No.: 693,781

[22] Filed: Jul. 22, 1996

[51] Int. Cl.⁶ .................................................. H01J 40/14
[52] U.S. Cl. ........................ 250/226; 356/419; 250/559.4
[58] Field of Search ................... 250/226, 208.1, 250/208.2, 559.29, 559.3, 559.4, 559.44; 356/399, 400, 401, 416, 419, 421

[56] References Cited

U.S. PATENT DOCUMENTS

| | | | |
|---|---|---|---|
| 4,769,537 | 9/1988 | Taillebois et al. | 250/226 |
| 4,774,494 | 9/1988 | Extance et al. | 250/226 |
| 4,778,988 | 10/1988 | Henderson | 250/226 |
| 4,956,555 | 9/1990 | Woodberry | 250/226 |
| 5,153,421 | 10/1992 | Tandon et al. | 250/208.1 |
| 5,223,708 | 6/1993 | van Deventer | 250/226 |
| 5,406,067 | 4/1995 | Keller | 250/226 |
| 5,637,862 | 6/1997 | Paolella | 250/226 |
| 5,648,653 | 7/1997 | Sakamoto et al. | 250/226 |

*Primary Examiner*—Edward P. Westin
*Assistant Examiner*—John R. Lee
*Attorney, Agent, or Firm*—R. Hutter

[57] ABSTRACT

Semiconductor chips for use in a chip array assembly for scanning of hard-copy images include rows of photosensors, each row of photosensors having a polyimide filter layer for passing one primary color. In addition to the photosensors, a reflective area is provided on the chip, with filter portions provided on the reflective area. The filter portions are created at the same time as the filter layers placed on the photosensors. The filter layers disposed on the reflective area can be used as test sites for determining the light transmissivity of the filter layers on the photosensors.

4 Claims, 2 Drawing Sheets

REFLECTIVE TEST PATCHES FOR TRANSLUCENT COLOR FILTERS IN PHOTOSENSITIVE SEMICONDUCTOR CHIPS

The present invention relates to an arrangement of color filters relative to photosensors on a photosensitive chip, as would be used, for example, in a full-color digital copier or scanner.

Image sensors for scanning document images, such as charge coupled devices (CCDs), typically have a row or linear array of photosites together with suitable supporting circuitry integrated onto a silicon chip. Usually, a sensor is used to scan line by line across the width of a document with the document being moved or stepped lengthwise in synchronism therewith. A typical architecture for such a sensor array is given, for example, in U.S. Pat. No. 5,153,421.

In a full-page-width image scanner, there is provided a linear array of small photosensors which extends the full width of an original document, such as 12 inches. These photosensors may be spaced as finely as 1200 to the inch on each chip. When the original document moves past the linear array, each of the photosensors converts reflected light from the original image into electrical signals. The motion of the original image perpendicular to the linear array causes a sequence of signals to be output from each photosensor, which can be converted into digital data.

A currently-preferred design for creating such a long linear array of photosensors is to provide a set of relatively small semiconductor chips, each semiconductor chip defining thereon a linear array of photosensors along with ancillary circuit devices. These chips are typically approximately ¾ inches in length; in order to create a practical full-page-width array, as many as twenty or more of these chips can be abutted end-to-end to form a single linear array of photosensors.

With the gradual introduction of color-capable products into the office equipment market, it has become desirable to provide scanning systems which are capable of converting light from full-color images into separate trains of image signals, each train representing one primary color. In order to obtain the separate signals relating to color separations in a full-color image, one technique is to provide on a semiconductor chip multiple parallel linear arrays of photosensors, each of the parallel arrays being sensitive to one primary color. Typically, this arrangement can be achieved by providing multiple linear arrays of photosensors which are physically identical except for a translucent primary-color overlay over the photosensors for that linear array. In other words, the linear array which is supposed to be sensitive to red light only will have a translucent red layer placed on the photosensors thereof, and such would be the case for a blue-sensitive array and a green-sensitive array. As the chip is exposed to an original full-color image, only those portions of the image which correspond to particular primary colors will reach those photosensors assigned to the primary color.

The most common substances for providing these translucent filter layers over the photosites are polyimide or acrylic. Polyimide is typically applied in liquid form to a batch of photosensor chips while the chips are still in undiced, wafer form. After the polyimide liquid is applied to the wafer, the wafer is centrifuged to ensure an even layer of a particular polyimide. In order to obtain the polyimide having the desired primary-color-filtering properties, the polyimide is doped with a pigment or dye of the desired color. When it is desired to place different kinds of color filters on a single chip, a typical technique is to first apply an even layer of polyimide over the entire main surface of the chip (while the chip is still part of the wafer) and then remove the unnecessary parts of the filter by, for example, photo-etching. Typically, all of the filter layer placed over the chip is removed except for those areas over the desired set of photosites.

With the various steps of creating the wafer having the chip circuitry therein, placing the various color filters on the wafer, dicing the wafers with the filters thereon, and then placing the chips with there filters in a chip array assembly, it is desirable that different portions of the chips be tested at various stages in the manufacturing and assembly process. Specifically, with regard to the present invention, it is desirable to test the actual thickness of an applied layer of a particular translucent filter layer as soon as possible after the filter layer is placed on the wafer. Whether a particular color filter layer is too thick or too thin will clearly have an effect on the amount of light reaching the particular photosensor which the filter layer is covering. If the filter layer is too thin, too much light will be passed to the photosensor, and if the filter layer is too thick, insufficient light will reach the particular photosensor; the overall effect of an incorrect thickness of the filter layer is a distortion in rendering a color image with the chip. It is most desirable to detect incorrect thicknesses of individual filter layers before the chip is installed in an assembly, or even more preferably before the wafer itself is diced into individual chips. If it is determined that an applied layer of filter material is unsatisfactory, either in terms of thickness or uniformity, the filter layer may be removed and the process retried.

As a practical matter, testing of the thickness of a given filter layer while a chip is still part of a wafer presents certain difficulties. One technique would be simply to use the photosensors on a particular chip to infer a thickness of a filter layer by simply measuring an actual output of the photosensors in response to a known light intensity; but this may be impractical for a chip which is still part of a wafer, and such testing could disrupt a manufacturing process.

The present invention provides a novel filter architecture and technique for determining an actual thickness of a translucent filter layer on a photosensitive semiconductor device, such as a silicon chip or wafer bearing a plurality of chips therein.

According to the present invention, there is provided a photosensitive semiconductor device, comprising a first photosensor and a second photosensor. A first color filter is disposed over the first photosensor, adapted to pass light only of a first predetermined wavelength, and a second color filter is disposed over the second photosensor, adapted to pass light only of a second predetermined wavelength. A reflective surface is provided on the device, a first portion of the reflective surface covered by a portion of the first color filter and not by the second color filter, and a second portion of the reflective surface covered by a portion of the second color filter and not by the first color filter.

Figure 2:
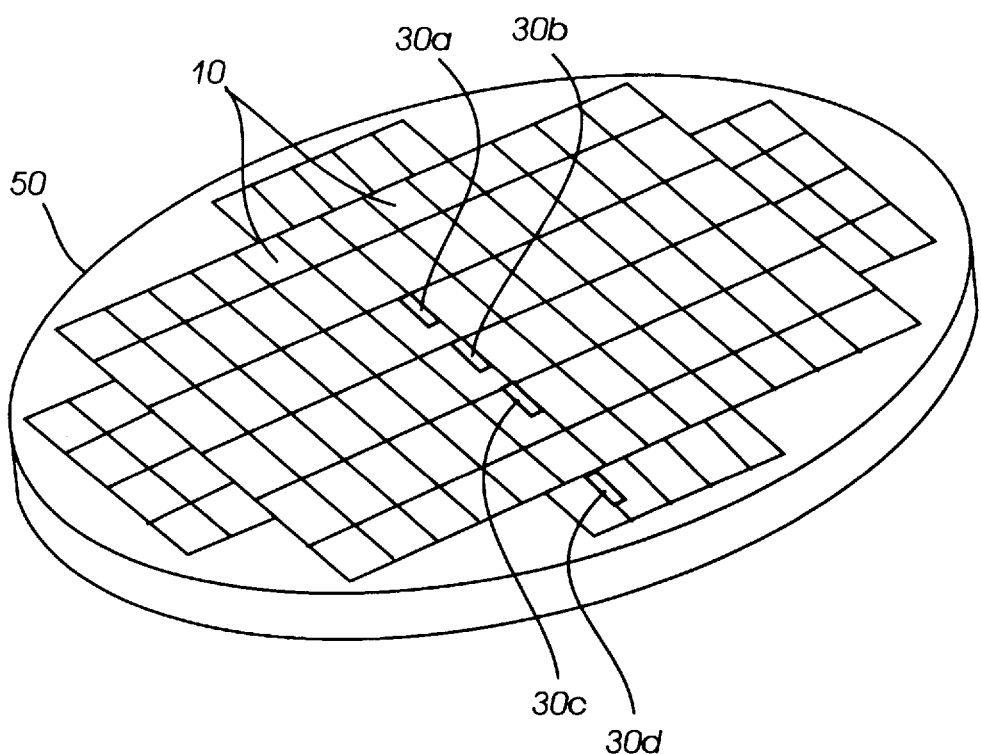

In the drawings:

FIG. 1 is a simplified plan view of a single photosensitive chip incorporating the present invention; and FIG. 2 is a perspective view of a wafer from which a plurality of photosensitive semiconductor chips may be diced, showing another embodiment of the present invention.

FIG. 1 is a simplified plan view of a single photosensitive chip 10, as would be used, for example, in a full-color photosensitive array for detecting light reflected from a full-color hard-copy image. In one embodiment of such a scanner, a plurality of chips 10 are butted together to form a single linear array corresponding to the width of a typical page; one patent showing a design of such an array, with a method of assembling it, is U.S. Pat. No. 5,510,273, assigned to the assignee hereof. Exposed on a top surface of the chip 10 is a plurality of photosensors 20, which are arranged in three parallel rows. Each individual row of photosensors is covered with a translucent filter layer, each filter layer being adapted to filter (that is, block out all light except) light of a particular primary-color wavelength. As shown in FIG. 1, the top row is covered with a filter layer 22R, to filter red light; the second row is covered with a filter layer 22G to filter green light; and the third row is covered with a blue filter 22B to filter blue light. It will be evident that, in the finished chip array assembly, the three rows of filtered photosensors 20 will independently provide digital signals corresponding to the different color separations in a full-color image.

Also shown in simplified form within chip 10 are three lines 24R, 24G, and 24B, which correspond to one or a plurality of photosensors of a particular color. As can be seen in FIG. 1, each of these lines has associated therewith at least one amplifier which may be controlled externally to adjust the magnitude of a raw signal coming from one or more photosensors of a particular color separation. Specific designs for collecting and downloading image signals from a chip such as 10 are known in the art.

Although the photosensors 20 on a particular chip 10 need to be exposed to an image being scanned, typically the bulk of the main surface of chip 10, such as shown in plan view in FIG. 1, is not light-sensitive, and is often a protective aluminum layer. This aluminum layer is typically substantially reflective. According to the present invention, a portion of this main surface of chip 10 is deliberately set aside as a reflective area, such as indicated as 30. This reflective surface 30 does not include any photosensitive structure with respect to the rest of the chip 10, but rather is simply a reflective surface. Disposed on the reflective surface 30 is set of filter portions indicated as 32. These filter portions correspond to the primary colors such as red, green and blue (R, G, B) for the photosensors 20, and are preferably made in the same filter-attachment steps as the filters placed on the photosensors 20. In this way, the filters 32 placed on reflective surface 30 accurately represent the properties, particularly the thickness, of the filter layers placed on each row of photosensors 20. For this reason, the filters 32 placed on reflective surface 30 can be used as a surrogate for testing the filter layers placed on photosensors 20.

Because the filters 32 are placed on a reflective surface 30 of chip 10 and not over photosensors 20, the thickness of the individual filters 32 is tested by shining a light beam of known wavelength profile and intensity on the filters 32 and then measuring the reflected light from each individual filter portion. If the amount of light reflected from a particular filter portion 32 is less than an expected amount, this can be taken as a good sign that the filter layer 22 of the same color is thicker than anticipated. Similarly, if the amount of light reflected from a particular filter portion 32 is higher than expected, this can be taken as a sign that the corresponding color filter 22 on a row of photosites 20 is too thin.

The advantage of using the reflective surface 30 to stand in for the behavior of the filters 22 on photosites 20 is that this reflective testing can be readily carried out as part of a mass-production process while the chips such as 10 are still part of a larger wafer. No electrical connection need be made to an individual chip 10 in order to perform this reflective test, and therefore the wafer would not have to be probed, as would have to happen if the response of one of the photosensors 20 were to be tested directly.

It is sometimes desirable to include on a photosensitive chip, in addition to filters for primary colors in the visible spectrum, filters for blocking non-visible wavelengths, such as infrared. In the context of the present invention, such an infrared filter (not shown) could be placed over the bulk of the chip 10, so that the infrared filter would work in combination with the other primary color filter layers 22. It is a design option whether such an extra filter would be included under or over the filters 32 in reflective surface 30.

FIG. 2 is a perspective view of a wafer 50, from which a large number of chips 10 (such as shown in FIG. 1) are subsequently diced; when the wafer is intact, each chip 10 corresponds to a "chip area" on the wafer. In one common technique for placing individual filter layers 22 on chips 10, a wafer such as 50 having a fairly large plurality of chips 10 defined therein is centrifuged from its center and liquid polyimide, pigmented to a particular primary color, is poured on the spinning wafer. Ideally, the spinning should cause the liquid polyimide to distribute evenly across the entire wafer, or more specifically to be distributed evenly over every individual chip within the wafer 50. However, the centrifugal forces on the liquid polyimide on the spinning wafer often cause the thickness of the liquid to vary depending on the distance from the center of the wafer.

For this reason, there is provided, on a chip 50 including a plurality of chips 10 therein, a set of reflective areas, 30a–30d as shown, placed at specific predetermined positions relative to the center of the chip 50. Although not shown in the view of FIG. 2, each of these distinct reflective areas 30a–30d will include the filter portions 32 thereon as shown in FIG. 1. These particular reflective areas 30a–30d may be disposed on portions of wafer 50 which will later be cleaved into chips 10, or alternately may be simply placed in non-chip areas on wafer 50. A measured reflectivity and inferred thickness of a particular filter layer at, for example, reflective portion 30a will indicate the filter thickness for all of the chips disposed at roughly the same circumference from the center of the wafer, and the measured reflectivity and inferred thickness of a filtered layer portion of an outer-lying reflective area such as 30d will indicate the filter layer thickness for those chips closer to the edge of the wafer 50.

Once it is determined that a particular chip 10, or set of chips to be cleaved from a wafer 50, has a filter of a thickness outside of a permissible range, various remedies may be applied. The simplest remedy may be to simply remove the unacceptable filter layer and try again. Another alternative, which may be practical in certain circumstances, is to adapt the behavior of the circuitry within individual chips 10 to compensate for a detected out-of-range filter layer. For example, if it is determined that, on a particular chip, the red filter 22R is thicker than anticipated and will therefore admit less light than may actually be in the image being scanned, the gain on a line such as 24R within the chip can be increased to compensate for the too-thick filter. This adjusting of an individual set of photosensors 20 can be performed after the particular chip is diced, or after it is installed in a chip array assembly; or it can even be incorporated in the image-processing software associated with the particular chip 10 when the chip is actually in use by a customer. What is important is that means are provided, within chip 10 or otherwise, to adjust the gain of a particular set of photosensors 20 associated with a single filter layer 22.

While the invention has been described with reference to the structure disclosed, it is not confined to the details set forth, but is intended to cover such modifications or changes as may come within the scope of the following claims.

We claim:

1. A photosensitive semiconductor device, comprising:
   a main surface;
   a first photosensor and a second photosensor disposed in the main surface;
   a first color filter disposed on the main surface over the first photosensor, adapted to pass light only of a first predetermined wavelength to the first photosensor, and a second color filter disposed on the main surface over the second photosensor, adapted to pass light only of a second predetermined wavelength to the second photosensor; and
   a first reflective surface defined in the main surface, spaced from the first photosensor and the second photosensor, covered by a portion of the first color filter and not by the second color filter, and a second reflective surface defined in the main surface, spaced from the first photosensor and the second photosensor, covered by a portion of the second color filter and not by the first color filter.

2. The device of claim 1, wherein the photosensitive semiconductor device is a wafer defining a plurality of chip areas, each chip area defining a main surface including a first photosensor and a second photosensor defined therein.

3. The device of claim 1, further comprising means for adjusting a gain associated with the first photosensor and the second photosensor.

4. The device of claim 1, further comprising a third reflective surface defined in the main surface, spaced from the first photosensor and the second photosensor, covered by a portion of the first color filter and not by the second color filter.

* * * * *